US012212116B2

(12) United States Patent
Boyd et al.

(10) Patent No.: US 12,212,116 B2
(45) Date of Patent: Jan. 28, 2025

(54) INTEGRATED CIRCUIT FOR A HIGHLY FLEXIBLE LOW NOISE LASER CURRENT SOURCE

(71) Applicant: Vector Atomic, Inc., Pleasanton, CA (US)

(72) Inventors: Martin M. Boyd, Pleasanton, CA (US); Jonathan David Roslund, Pleasanton, CA (US); Gunnar E. Skulason, Pleasanton, CA (US)

(73) Assignee: Vector Atomic, Inc., Pleasanton, CA (US)

( * ) Notice: Subject to any disclaimer, the term of this patent is extended or adjusted under 35 U.S.C. 154(b) by 769 days.

(21) Appl. No.: 17/208,103

(22) Filed: Mar. 22, 2021

(65) Prior Publication Data

US 2022/0302673 A1    Sep. 22, 2022

(51) Int. Cl.
*H01S 5/026* (2006.01)
*H01S 5/042* (2006.01)

(52) U.S. Cl.
CPC .......... *H01S 5/0261* (2013.01); *H01S 5/0427* (2013.01)

(58) Field of Classification Search
CPC ............................. H01S 5/0239; H01S 5/0265
USPC ...................................................... 372/38.02
See application file for complete search history.

(56) References Cited

U.S. PATENT DOCUMENTS

| | | | | |
|---|---|---|---|---|
| 6,320,890 B1 * | 11/2001 | Taguchi | ................... | H03F 3/087 |
| | | | | 372/38.07 |
| 2006/0078018 A1 * | 4/2006 | Moriya | ............... | G06K 15/1209 |
| | | | | 372/38.02 |
| 2016/0322455 A1 * | 11/2016 | Woodford | ............... | H01L 28/24 |

FOREIGN PATENT DOCUMENTS

| | | | | |
|---|---|---|---|---|
| JP | 2000200939 | * | 12/1998 | ............... H01S 5/00 |
| JP | 2000200939 A | | 7/2000 | |

OTHER PUBLICATIONS

"Datasheet and Operating Guide WLD33ND & WLD33ND-EV: Laser Diode Driver & Evaluation Board," Wavelength Electronics, Dated: Feb. 2022, pp. 1-29.
PCT, Notification of Transmittal of The International Search Report and The Written Opinion of The International Searching Authority, or The Declaration for Application PCT/US2022/071242 dated Aug. 26, 2022.
Erickson, et al. "An Ultrahigh Stability, Low-Noise Laser Current Driver with Digital Control", Review of Scientific Instruments vol. 79, Ameican Institute of Physics, 2008.
Libbrecht, et al. "A Low-Noise High-Speed Diode Laser Current Controller", Review of Scientific Instruments, vol. 64, American Institute of Physics, 1993.
Seck, et al., "Noise Reduction of a Libbrecht-Hall Style Current Driver", arXiv:1604.00374v2, Jun. 15, 2016.

(Continued)

*Primary Examiner* — Tuan N Nguyen
(74) *Attorney, Agent, or Firm* — Patterson + Sheridan, LLP

(57) ABSTRACT

Embodiments herein describe an ASIC design where certain portions of the laser driver are controllable by the user. In one embodiment, the ASIC may include one or more pins which provide a connection interface where the user can electrically connect a sense resistor that corresponds to the particular laser being used. The remaining portions of the laser driver are implemented in the ASIC, thereby giving the user the flexibility to adapt the laser driver to her selected laser while having the advantages that come from using an ASIC.

18 Claims, 9 Drawing Sheets

(56) References Cited

OTHER PUBLICATIONS

Taubman, Matthew S., "Low-Noise High-Performance Current Controllers for Quantum Cascade Lasers", Review of Scientific Instruments, vol. 82, American Institute of Physics, 2011.

Williams, Jim, "Current Sources for Fiber Optic Lasers", Linear Technology, Linear Technology Corporation, Application Note 90, Apr. 2002.

Invitation To Pay Additional Fees And, Where Applicable, Protest Fee for International Application No. PCT/US2022/071242 Mailed Jun. 30, 2022.

* cited by examiner

INTEGRATED CIRCUIT FOR A HIGHLY FLEXIBLE LOW NOISE LASER CURRENT SOURCE

STATEMENT OF GOVERNMENT INTEREST

This invention was made with government support under contract W911NF20C0013 awarded by the United States Army Research Office. The government has certain rights in the invention.

BACKGROUND

There is a growing push to develop quantum technologies for computing, inertial sensing, atomic clocks, and secure communication. Most non-cryogenic quantum systems employ lasers for precise preparation, manipulation, and readout of the state. Precision laser interrogation of atoms and ions has resulted in the highest quality qubits to date. Though applications and implementations differ greatly, laser-based quantum devices typically have very demanding laser requirements. For example, lasers used for ion manipulation (e.g. $Yb^+$) span wavelengths 369-935 nm. The electronics for these lasers have current noise, voltage compliance, and modulation feature requirements beyond those developed as ASICs for commercial telecommunications markets, which use lasers with wavelengths typically greater than 1000 nm (e.g., 1310 nm and 1550 nm), and have relaxed requirements for current noise, and low compliance voltage. Researchers in the field of laser-based quantum systems must turn to costly and bulky "research-grade" lasers and electronics, which are the primary failure mechanism and cost driver for the experiments. Current quantum systems are not scalable as implemented and they become exponentially less reliable and more expensive as the laser count grows. Practical quantum devices require inexpensive, small, reliable, and autonomous lasers and electronics to meet expectations for performance, cost, and lifetime to compete with conventional technologies.

Commercially available integrated circuits (ICs) serve the laser market for operation of diodes with low compliance voltage, relaxed noise requirements, and in applications which do not require complex servos. These ICs are typically used in telecommunication applications and do not satisfy the ultralow-noise, high-speed laser requirements of quantum systems, nor support diode voltages needed for visible wavelengths.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

SUMMARY

Figure 1A:
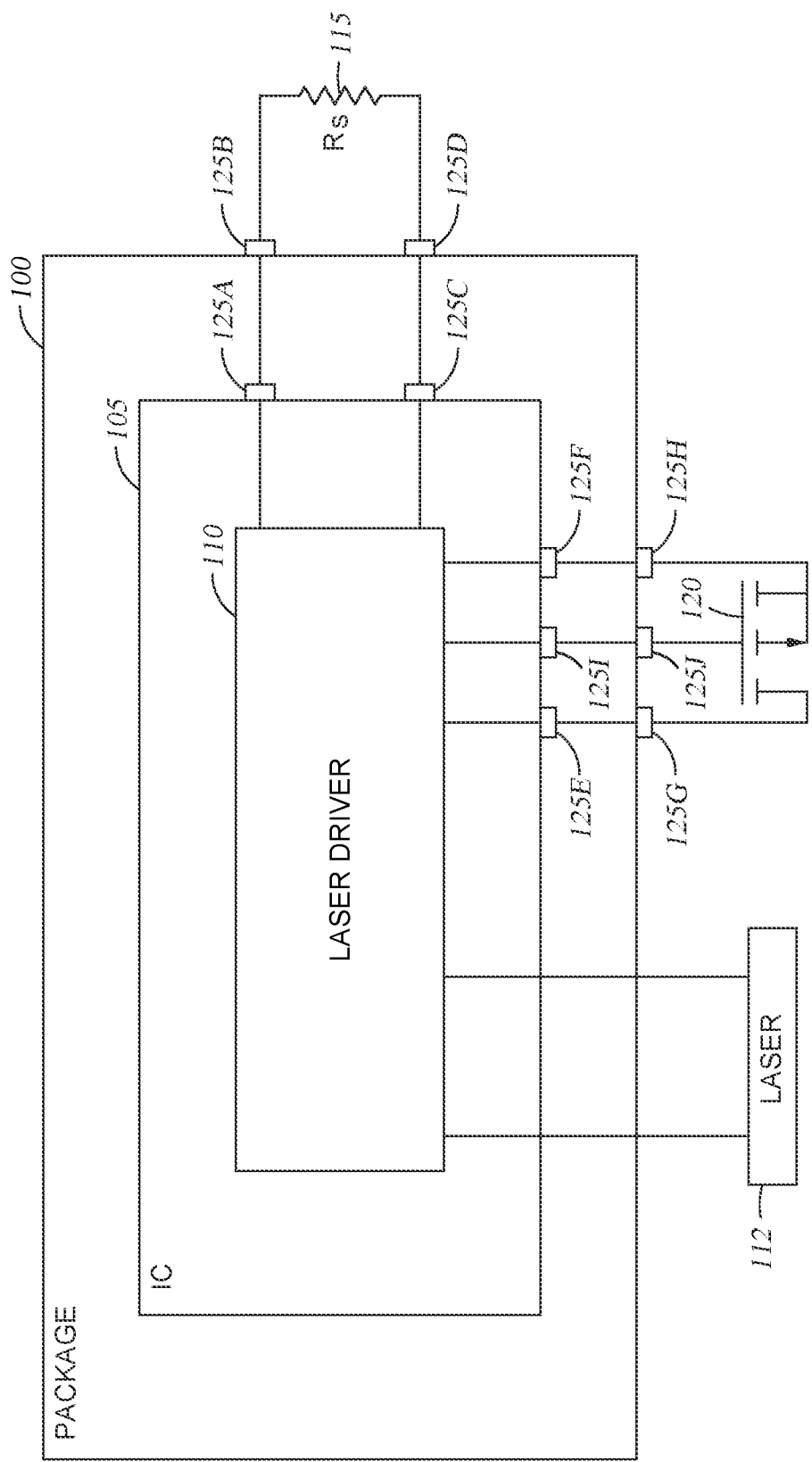
FIGS. 1A-1C illustrate laser drivers with user-selectable sense resistors and transistors, in one embodiment described herein.

One embodiment presented in this disclosure is an integrated circuit that includes a laser driver, a first connection interface configured to connect the laser driver to a resistor external to the integrated circuit, and a second connection interface configured to connect an output of the laser driver to a laser external to the integrated circuit. Further, when the resistor is connected to first connection interface, the resistor is part of the laser driver and affects the output of the laser driver.

Another embodiment presented in this disclosure is a package that includes a first connection interface configured to connect to a resistor external to the package, a second connection interface configured to connect to a laser external to the package, and an integrated circuit. The integrated circuit includes a laser driver, a third connection interface electrically coupling the first connection interface to the laser driver, and a fourth connection interface electrically coupling the second connection interface to an output of the laser driver. Further, when the resistor is connected to first connection interface, the resistor is part of the laser driver and affects the output of the laser driver.

Another embodiment presented in this disclosure is a package that includes a selectable bank of resistors, a first connection interface configured to receive a select signal that sets a resistance value of the selectable bank of resistors, a second connection interface configured to connect to a laser external to the package, and an integrated circuit. The integrated circuit including a laser driver, a third connection interface electrically coupling the laser driver to the selectable bank of resistors, wherein the selectable bank of resistors affects an output of the laser driver, and a fourth connection interface electrically coupling the second connection interface to the output of the laser driver.

Another embodiment presented in this disclosure is an integrated circuit that includes a laser driver comprising a variable resistance element configured to control an output of the laser driver, a first connection interface configured to receive an external select signal that sets the value of the variable resistance element, and a second connection interface configured to connect an output of the laser driver to a laser external to the integrated circuit.

DETAILED DESCRIPTION

Embodiments herein describe integrating a laser driver for a laser into an application specific integrated circuit (ASIC). As mentioned above, many quantum devices use lasers with wavelengths shorter than the lasers typically used in the telecommunications industry (e.g., less than 1000 nm). These lasers (or laser diodes) generally require larger voltages and lower noise. For example, a telecom laser typically requires diode voltages of less than 2.5 V while the lasers used in quantum devices often have diode voltages greater than 2.5 V, and some greater than 7 V.

Implementing a laser driver in an ASIC for a quantum device is difficult due to the high power demands and the wide range of voltages that are typical for these lasers (e.g., from 2.5 V to 7 V). Thus, the laser driver needs to be flexible enough to accommodate many different types of lasers. This lack of flexibility, along with high noise, has prevented previous ASIC solutions.

The embodiments herein describe an ASIC design where certain portions of the laser driver are controllable by the user. For example, some laser driver designs use a precise sense resistor with low temperature coefficient to control the current used to drive the laser diode. In one embodiment, the ASIC may include one or more pins which provide an interface where the user can electrically connect a sense resistor that is compatible with the voltage requirements of a particular laser. The remaining portions of the laser driver are implemented in the ASIC, thereby giving the user the flexibility to adapt the laser driver to her selected laser while having the advantages that come from using an ASIC—e.g., scalability, reduced cost, reliability, etc. In other embodiments, rather than having an external resistor, the ASIC may be part of a package which contains a bank of selectable resistors. Using a select signal, the user can select a desired resistance from the bank of resistors to use as the sense resistor. In yet another embodiment, the ASIC itself can have a variable resistance (e.g., a bank of selectable resistors) that the user can set to have the desired resistance, although resistors fabricated in silicon ASICs typically do not have the low drift (and high precision) characteristic required by many quantum systems.

In addition to providing a user-controllable resistance, the embodiments herein can provide other controllable circuit elements to the user. For example, some lasers may require higher current sources which, if implemented in the ASIC, may generate too much heat. The ASIC may instead have a connection interface (e.g., one or more pins) that enable the user to couple an external high power transistor to the laser driver, or the packaging containing the ASIC may include a high power transistor that can be selected by the user. In another example, the ASIC may include a modulator for modulating the current used to drive the laser. This modulator may also have resistances that may need to be varied depending on the current being provided to the laser. Thus, these resistances can become user-controllable by providing pins so the user can connect her own resistors, or the package or ASIC can include a bank of user-selectable resistors. In addition, the ASIC can support using different polarity laser diodes by providing alternative transistors that can be selected depending on the type of the laser diode.

Figure 1B:
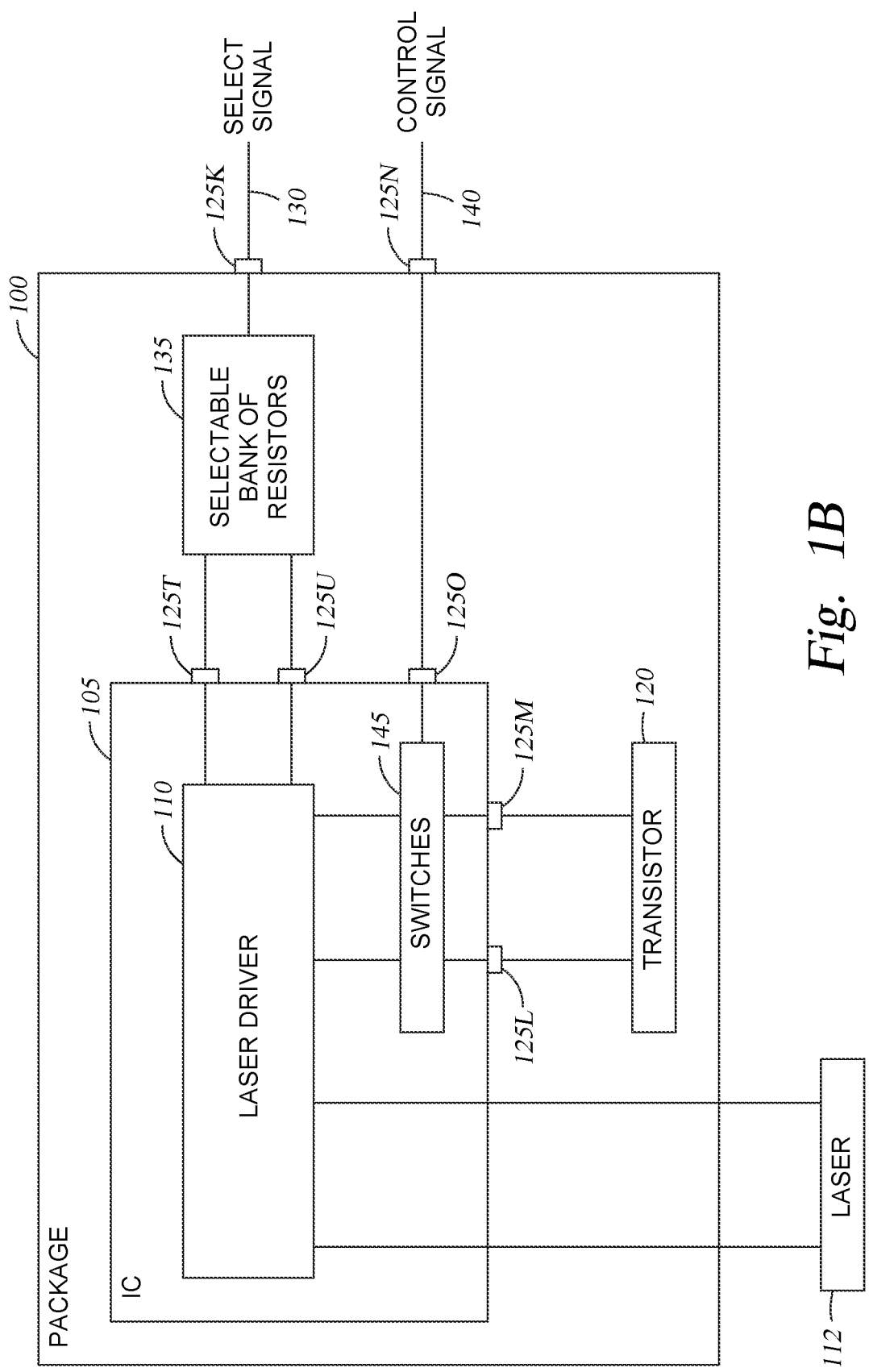
Figure 1C:
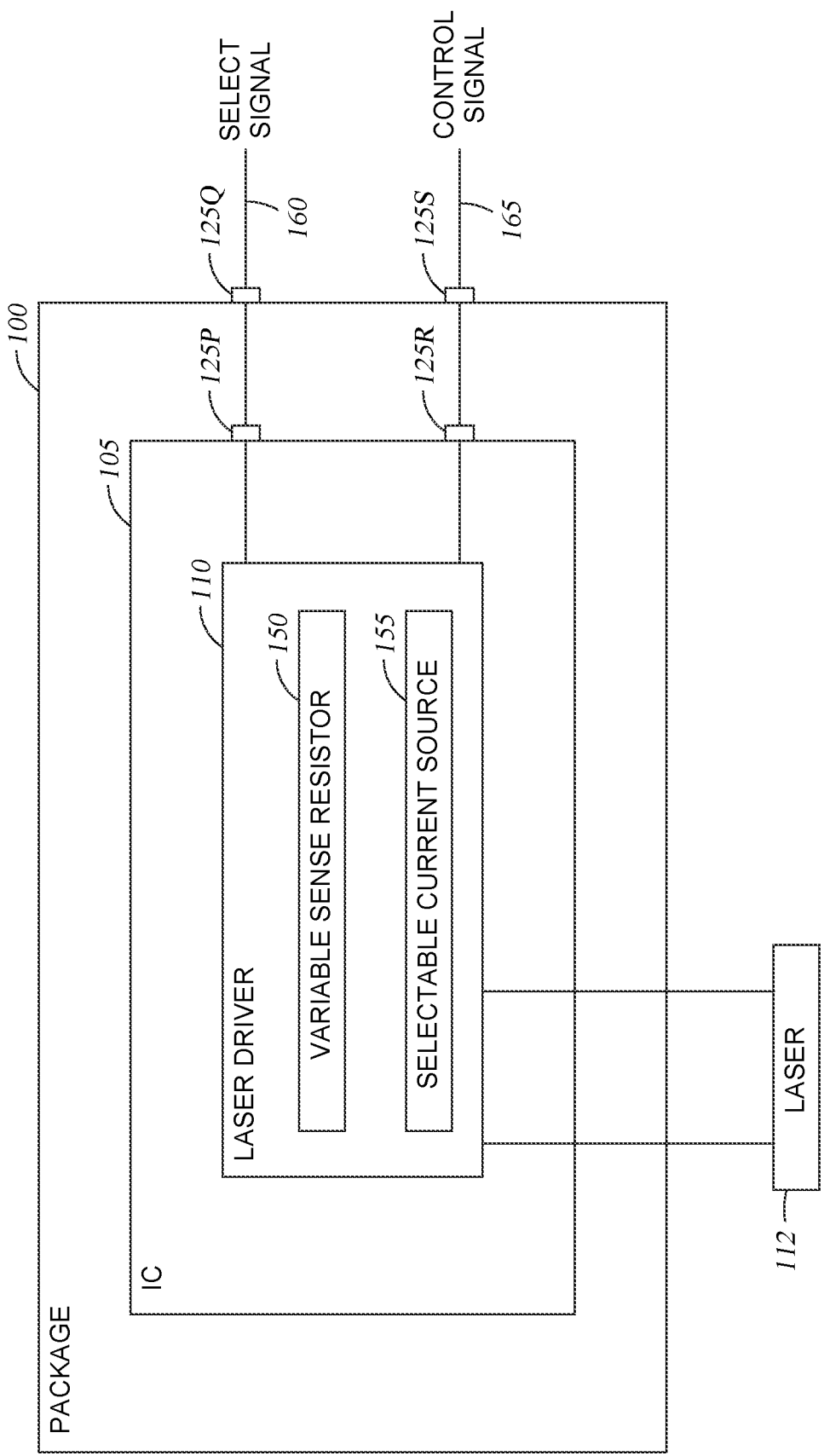

FIGS. 1A-1C illustrate laser drivers with user-selectable sense resistors and transistors, in one embodiment described herein. Specifically, FIG. 1A illustrates a package 100 that contains the IC 105 (e.g., an ASIC). The package 100 can include a protective covering for the IC 105 (e.g., an insulative material) that encapsulates the IC 105 as well as a substrate. Further, the package 100 can include additional ICs which are packaged together. For example, the IC 105 may be bonded (e.g., using solder bumps or wire bonds) to other ICs in the packaging 100. However, in other embodiments, the IC 105 may not include any packaging 100. In that case, ports 125 on the IC 105 (e.g., pins, bond pads, or other types of connection interfaces) may be directly accessible to a user. However, in FIG. 1A, the ports 125 on the IC 105 may be indirectly accessible via ports 125 of the package 100 (e.g., pins or connectors that are part of a substrate in the package 100). For example, the ports 125 for the package 100 may be part of an interposer or other type of substrate on which the IC 105 is mounted in the package 100.

The IC 105 includes a laser driver 110 that drives a laser 112 (or, more specifically, a laser diode). The laser driver 110 can provide a current at the required compliance voltage for driving the laser 112. As shown, the laser 112 is external to the IC 105 and the package 100. For example, the package 100 may be sold as a separate component or a piece part that a user can then dispose on a board (e.g., a printed circuit board) along with the laser 112. Although not labeled in FIG. 1A, the package 100 and the IC 105 may include separate ports (e.g., pins or other type of connection interface) for coupling the laser driver 110 to the laser 112. For example, the package 100 and the laser 112 may be coupled to a board which has traces that electrically connect the two components.

In addition to the laser 112, FIG. 1A also illustrates a sense resistor ($R_s$) 115 and transistor 120 which are external to the package 100 but are electrically connected to the laser driver 110 via ports 125. For example, the sense resistor 115 is coupled to the laser driver 110 via ports 125A-D while the transistor 120 is coupled to the laser driver 110 via ports 125E-J. In this example, the sense resistor 115 is selected by the user. Put differently, the IC 105 is designed so that the ports 125A and 125C are exposed to the user so that the sense resistor 115 can be coupled into the laser driver 110. That is, the sense resistor 115 forms a portion of the laser driver 110 even though the resistor 115 is external to the IC 105 and the package 100.

There are several advantages of designing the IC 105 so that an external sense resistor 115 can be added to the laser driver 110. One advantage is flexibility since, as described in more detail below, the user can optimize noise versus required voltage at the laser based on their specific application. Because the user may choose to use a wide variety of lasers 112 that have different compliance voltage requirements, allowing the user to select the value of the resistor 115 enables the laser driver 110 to power a wide range of lasers 112 which have different voltage requirements. Table 1 below illustrates a non-exhaustive list of different wavelengths of example lasers which may be used for quantum systems and their corresponding diode voltages required to operate these lasers.

TABLE 1

| Wavelengths | $V_{diode}$ |
| --- | --- |
| 369-430 nm | 4-5V |
| 450-470 nm | 4.5-7.5 V |
| 480-510 nm | 4.5 V |
| 600-740 nm | 3-3.5 V |
| 780-852 nm | 2-3 V |
| 900 + nm | 1.8-2.5 V |

Providing the user with the ability to change the value of the sense resistor 115 enables the user to use the same laser driver 110 for all these different types of lasers. Put differently, the same IC 105 can be used to power the different lasers listed in Table 1. Further, the embodiments herein provide the ability to change the sense resistor to optimize for noise, where larger resistances reduce the noise generated by the laser driver.

Further, it is more difficult to fabricate low drift, high precision, and accurate resistors in an IC 105 relative to a discrete resistor 115. Thus, using an external resistor 115 can provide an ultralow noise laser driver 110 with low temperature coefficient. In yet another advantage, the laser driver 110 may have a digital to analog converter (DAC) for establishing a set voltage used to control the output current of the laser driver 110. Using an external resistor 115 can provide fine-tuning for the DAC in the laser driver 110. Stated differently, the value of the resistor 115 can be selected to tune the DAC to provide a very accurate reference current for the laser driver 110.

Providing the ports 125E-J that enable the user to connect the transistor 120 to the laser driver 110 also improves the overall flexibility of the laser driver 110. While most lasers 112 require a current of a few hundred milliamps—e.g., 300 mA or less—some high-power lasers 112 used in quantum devices operate at 1 A. While the laser driver 110 can include an internal transistor for providing this amount of current, in FIG. 1A, it is assumed the internal current source in the laser driver 110 cannot supply this much current. One reason for not placing a current source that can output 1 A of current is that these generate significantly more heat which may add complexity to the package 100 for dissipating the heat, such as a heat sink, or increasing the size of the IC 105. Instead, by exposing the ports 125E-J to the user, the user can couple a high-power transistor 120 to the current source in the laser driver when necessary 110. That is, while the transistor 120 is external to package 100 and IC 105, the transistor 120 is part of the current source in the laser driver 110. The laser driver 110 can then use the output of the transistor 120 for supplying larger currents to the laser 112 than are enabled by an internal transistor in the current source of the laser driver 110. However, if the user chooses to use a laser 112 that does not require a high current, the transistor 120 can be omitted and the current source in the laser driver 110 can use its internal transistor (e.g., a default transistor) to power the laser 112.

Moreover, when the high-power transistor 120 is enabled, this may also generate large currents through the sense resistor 115 which can create significant heat. Thus, leaving the sense resistor 115 out of the IC 105 can make heat management easier since the resistor 115 is easily accessible and many cooling techniques are readily available.

FIG. 1A does not show all the details of coupling the sense resistor 115 and the transistor 120 to the laser driver 110. For example, in addition to connecting to the drain and source of the transistor 120, the IC 105 and package 100 may include separate ports for coupling to the gate of the transistor 120. Further, while a single resistor 115 is shown, the user may use a variable resistor or multiple parallel resistors to set the value of the sense resistor 115.

FIG. 1B illustrates a different technique for adding the sense resistance and the transistor 120 to the laser driver 110 in an ASIC. Here, the package 100 includes a selectable bank of resistors 135 and the transistor 120. That is, instead of the user having to provide the sense resistor 115 and the transistor 120, in FIG. 1B the package 100 includes the resistors 135 and the transistor 120. Thus, the user simply has to select which resistors in the bank of resistors 135 she desires for the sense resistor using a select signal 130 via a port 125K. The advantage of using the bank of resistors 135 is convenience to the user who does not need to add a resistor or couple the resistor to a board. Moreover, if the user decides to use a different laser 112 which requires a corresponding change in the sense resistor, she can use the select signal 130 to select a different resistor of the bank of resistors 135. Also, the bank of resistors 135 can include high-quality discrete resistors, and thus, have the same advantages of using the discrete resistor 115 along with the added advantage of convenience for the user.

Disposing the transistor 120 in the package 100 also provides added convenience for the user. Also, the transistor 120 and the bank of resistors 135 may be easier to keep cool than if these circuit elements were in the IC 105. For example, the transistor 120 and bank of resistors 135 may be directly attached to a heat sink in the package 100. FIG. 1B illustrates a control signal 140 that can be used to activate and deactivate switches in the IC 105 to enable or disable the transistor 120. In one embodiment, if the laser 112 is not a high-power laser (e.g., requires a current of only a few hundred milliamps), the user can set the control signal 140 so that the switches 145 disable the transistor 120 and the laser driver 110 relies on an internal transistor (not shown) in its current source to drive the laser 112. However, if the laser 112 is a high-power laser, the user can set the control signal 140 so that the switches 145 enable the transistor 120 so it provides the high current to the laser 112.

In one embodiment, the transistor 120 may be part of a separate IC in the package 100 or can be a discrete component—e.g., a discrete transistor. If the transistor 120 is implemented in another IC, that IC may be wire bonded or solder bonded (e.g., flip chipped bonded) to the IC 105. Further, in another embodiment, the transistor 120 is part of the package 100 while the sense resistor is external to the package 100 as shown in FIG. 1A, or the reverse where the package 100 includes the bank of resistors 135 but the transistor 120 is external to the package 100.

FIG. 1C illustrates disposing a variable sense resistor 150 and a selectable current source 155 in the IC 105. Currently, it is not desired to put the sense resistor 150 in the IC 105 due to limitations in fabrication processes used to produce the IC 105 (e.g., CMOS fabrication technologies). These limitations result in higher-noise sense resistors. Thus, using sense resistors that are external to the IC as shown in FIGS. 1A and 1B is generally preferred for quantum systems with low noise requirements. However, fabrication processes for variable resistors may improve in the future, or for some laser driver applications, higher noise and drift sense resistors may be acceptable. Thus, instead of using an external sense resistor, the laser driver 110 has an internal variable resistor 150 that can be tuned using a select signal 160 and ports 125P and 125Q. Like above, the user can set the variable resistor 150 to a resistance that delivers the desired output power to the laser 112. The advantage of using an internal variable sense resistor 150 is that it can reduce the size and complexity of the overall system since a discrete resistor can be omitted (from either the package 100 or the board). Thus, the user has the flexibility of being able to set the sense resistor 150 to a desired value like in FIGS. 1A and 1B along with the additional advantages of reducing the footprint and complexity of the overall system.

FIG. 1C also illustrates disposing a high-power current source 155 into the IC 105 and laser driver 110. As mentioned above, doing so may generate substantially more heat in the IC when the current source 155 is enabled. As such, the package 100 may include additional heat sinks and other cooling strategies that are not used for the ICs in FIGS. 1A and 1B.

To select whether the high-power current source 155 is enabled or disabled, the IC 105 and package 100 include ports 125R and 125S that receive a control signal 165. The user can set the control signal 165 to enable the current source 155 to deliver a high current to the laser 112 or disable the current source 155 so that the laser driver 110 uses a default, or low-power current source (not shown), to power the laser 112.

In sum, FIGS. 1A and 1B illustrate connecting components (e.g., a sense resistor and an additional transistor) that are external to an IC and to a laser driver disposed in the IC. These external components are part of the laser driver even though they are not disposed in the same IC as the laser driver. These external components can be external to the package (e.g., as shown in FIG. 1A) or be integrated into the same packaging as the IC (e.g., as shown in FIG. 1B). Further, the sense resistor can be a single resistor, a bank of resistors (where one or more resistors are selected), or a variable resistor. The IC and package in FIGS. 1A and 1B provide connection interfaces (e.g., ports 125) so that the external components can be connected to the laser driver, or the user can select the sense resistance and enable/disable the current source using control/select signals.

FIG. 1C, on the other hand, illustrates incorporating a variable resistor (or a bank of selectable resistors) along with a user-selectable current source 155 into the same IC as the laser driver. The IC and package can include connection interfaces so that the user can still control the value of the sense resistor and selectively enable and disable the current source. Thus, FIGS. 1A-1C all illustrate a laser driver with the flexibility to drive many different types of lasers having a variety of current and voltage requirements (e.g., different diode voltages as shown in Table 1). Further, as discussed below, the laser driver can have very little noise (i.e., ultra-low noise) due to its circuit design.

Figure 2:
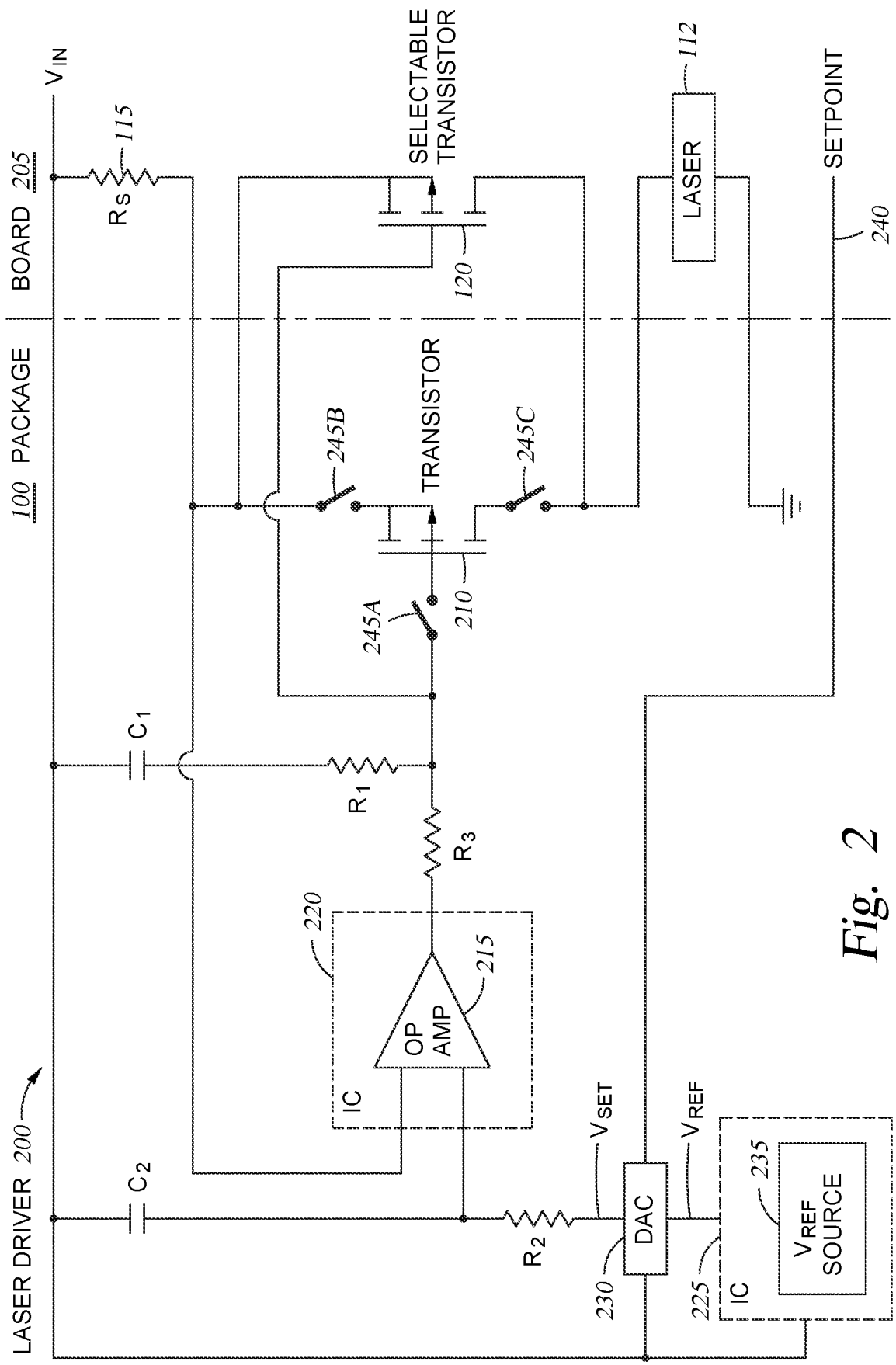
FIG. 2 illustrates an exemplary operational setup of a laser driver, in one embodiment described herein.

FIG. 2 illustrates an exemplary operational setup of a laser driver 200, in one embodiment described herein. FIG. 2 is divided into components within the package 100 and components that are disposed on a board 205 on which the package 100 may be mounted. The traces crossing the middle, dividing line between the package 100 and the board 205 indicate electrical connections between the various components. In this example, the board 205 includes the discrete sense resistor 115, the selectable transistor 120, and the laser 112, which is similar to the embodiment illustrated in FIG. 1A.

The package 100 can include one or more ICs. That is, the electrical components on the left half of FIG. 2 can all be implemented in the same IC (e.g., IC 105 in FIG. 1A) or in multiple ICs. For example, it may be advantageous to implement some of the components in the package 100 on multiple ICs that are wire or solder bonded to each other. For example, FIG. 2 illustrates an operational amplifier (op amp) 215 and reference voltage ($V_{REF}$) source 235 which may be implemented on separate ICs. For instance, to achieve ultralow noise, the laser driver 200 may require a very low noise op amp 215 in addition to the ultralow noise resistor 115. Such op amps 215 are difficult to implement in complex integrated circuits, however, many current chip manufactures already offer ultralow noise op amps 215 in separate ICs. Thus, it may be more cost effective to obtain the IC 220 containing the op amp 215 and the IC 225 containing the reference voltage source 235 and then bond these ICs to an IC containing the rest of the components shown on the left side of FIG. 2. In that example, the package 100 would contain three ICs: IC 220, IC 225, and a third IC containing the rest of the components which are electrically bonded together. As mentioned above, these ICs could be wired bonded, solder bonded, flipped chip bonded, and the like. They could then be mounted on a common substrate or interposer and encased in an insulative material to form the package 100. Further, while FIG. 2 illustrates the IC 225 containing only the $V_{REF}$ source 235, in one embodiment, the IC 225 can also include the DAC 230.

As shown, the laser driver 200 includes the sense resistor 115 where a first end is coupled to $V_{IN}$ and the capacitors $C_1$ and $C_2$ and its second end is coupled to the transistor 210 (which is referred to as the internal transistor since it is part of an IC in the package 100). One input of the op amp 215 is connected to the sense resistor 115. The other input of the op amp 215 is coupled to the capacitor $C_2$ and resistor $R_2$. The output of the op amp 215 is coupled to $R_3$ and the gate of the transistor 210. Generally, the output of the op amp 215 controls the transistor 210 to drive a current that powers the laser 112. In one embodiment, the combination of the op amp 215, a set voltage ($V_{SET}$), the sense resistor 115, and either the transistor 210 or the transistor 120 form the current source for the laser driver 200.

The op amp 215 also measures voltage drop across the sense resistor 115 and also the noise associated with the sensor resistor 115 and $V_{IN}$ and servos it out by comparing its first input corresponding to the $V_{SET}$ generated by a DAC 230 to its second input coupled to the sense resistor 115. The op amp 215 forces the current to be stable through the resistor 115 that causes the current to be stable through the transistor forming the transistor 210 (or the transistor forming the external transistor 120 assuming it is enabled instead).

The noise generated by the laser driver 200 can be approximated by the noise generated by the op amp 215 divided by the value of the sense resistor 115. Thus, to reduce noise, the value of the resistor 115 should be as large as possible. However, this must be balanced by the voltage drop across the resistor 115 as its value increases. The greater the voltage drop, the less current the transistor 210 can deliver to the laser 112. Thus, placing the sense resistor 115 outside the IC provides greater flexibility to choose a value of the resistor 115 that minimizes noise and still provides sufficient current to the laser 112 to satisfy its diode voltage.

Further, $R_1$, $R_3$, and $C_1$ help to compensate for the characteristics transistor 210. If the internal transistor 210 is used, then $R_1$ and $C_1$ can be customized to compensate for its characteristics. However, since the user has the flexibility to select a different type of transistor for the external transistor 120, the values of $R_1$ and $C_1$ may not be ideal for this transistor. In one embodiment, the package 100 may include connections interfaces for these circuit components so they are moved outside of the IC and package 100 like the sense resistor 115. That way, the user can select values for these circuit elements to compensate for the particular transistor 120 used. In another embodiment, $R_1$ and $C_1$ may be in the package 100 and are used when the selectable transistor 120 is disabled (or omitted). However, when the user has enabled the external transistor 120, the IC may have switches for disconnecting $R_1$ and $C_1$ from the circuit and other switches for connecting a different resistor and capacitor on the board 205 into the circuit, where the values of these circuit elements are selected to compensate for the characteristics of the external transistor 120. In that example, the user not only connects the external transistor 120 on the board 205 to the package 100 but also a corresponding resistor and capacitor, which are in addition to the sense resister 115.

Also shown in FIG. 2, the IC containing the internal transistor 210 includes switches 245A-C for disconnecting the internal transistor 210 when the selectable transistor 120 has been coupled to the laser driver 200. That is, when the user desires to use the internal transistor 210, the switches 245A-C are closed, but when the user has connected a selectable transistor 120 to the driver 200, the switches are open to remove the transistor 210 from the current source so that the selectable transistor 120 drives the laser 112. While FIG. 2 illustrates using switches 245, in another embodiment pins can be used to selectively connect the transistors 210 and 120 into the current source circuit.

The laser driver 200 also illustrates a setpoint 240 which is a user controlled signal to adjust the voltage at the input of the op amp 215. The setpoint 240 is transmitted to the DAC 230 along with a reference voltage generated by the reference voltage source 235. The output of the DAC 230 drives one of the inputs of the op amp 215 which sets the current delivered to the laser 112 by controlling the gates of the transistors 210 or 120. Generally, the DAC 230 provides a fine tune control for setting the current used to drive the laser 112, while the reference voltage source 235 provides a stable reference voltage. In one embodiment, to minimize noise, the DAC 230 and $V_{REF}$ are not grounded, but are referenced to $V_{IN}$.

The setpoint 240 and other circuit elements (e.g., switches 245) can be set or controlled by a user using a Serial Peripheral Interface (SPI) or Inter-Integrated Circuit (I2C) communication bus. In general, the laser driver 200 can be controlled using a microcontroller, digital processor, field programmable gate array (FPGA), and the like.

FIG. 2 illustrates an operational setup of the laser driver 200 when using external components as shown in FIG. 1A. But one of ordinary skill will recognize that it can be modified if the package 100 has the configurations shown in FIGS. 1B and 1C. In those cases, the board 205 provides the control and select signals to the package 100 for controlling the sense resistors and enabling/disabling the high power transistor 120.

While FIG. 2 illustrates a laser driver 200 for providing constant current to the laser 112, in other embodiments it may be advantageous to modulate the current driven onto the laser 112. Many quantum devices use a fast modulation scheme to make small adjustments to the output of the laser. The embodiments below discuss laser drivers with a modulator, such as, for example, the Libbrecht-Hall current source in FIG. 4.

Figure 3A:
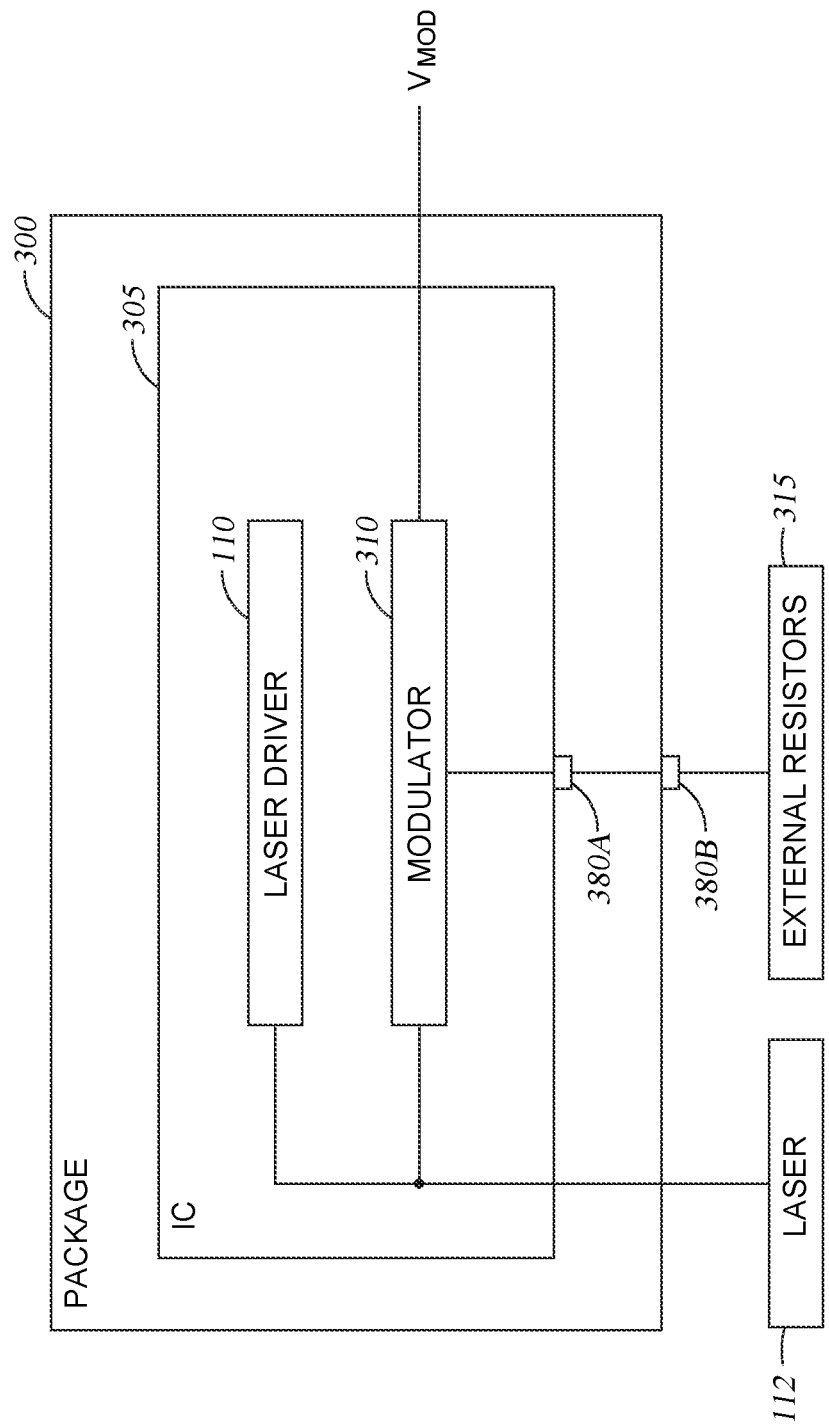
FIGS. 3A and 3B illustrate laser drivers with modulators and selectable resistors, in embodiments described herein.
Figure 3B:
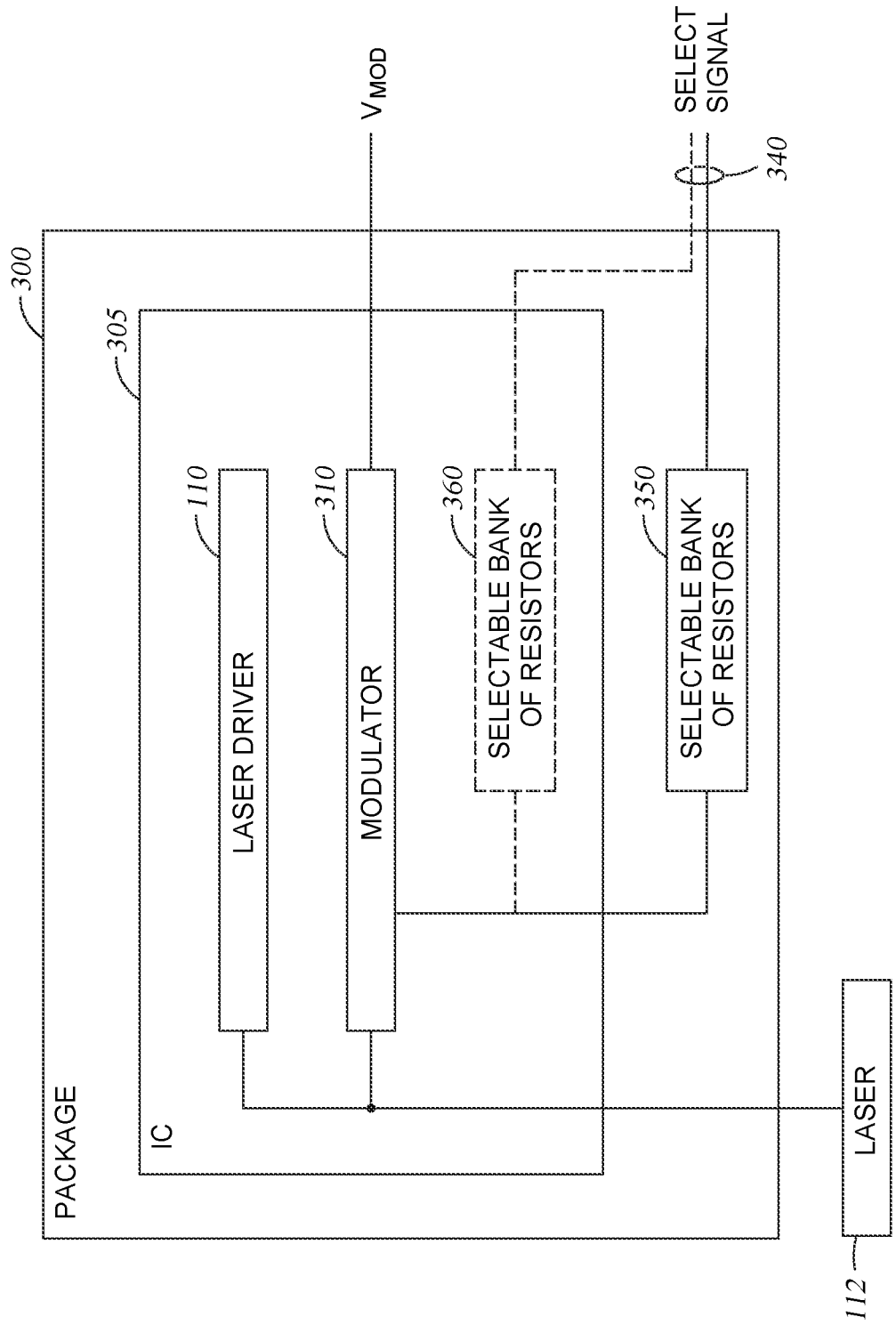

FIGS. 3A and 3B illustrate laser drivers with modulators and selectable resistors, in one embodiment described herein. FIG. 3A illustrates a package 300 containing an IC 305 with a laser driver 110. The package 300 can have any of the arrangements and configuration discussed above. For example, the package 300 may contain multiple ICs as illustrated in FIG. 2. Further, the package 300 may have interface connections for coupling the laser driver to an external sense resistor and transistor (not shown here). Alternatively, the package 300 itself could include a bank of selectable sense resistors and a selectable transistor, or the main IC in the package 300 may contain a variable sense resistor and multiple selectable transistors.

In addition to the laser driver 110, the IC 305 includes a modulator 310 which receives a modulation voltage as input ($V_{MOD}$) and provides a modulated current, along with the current provided by the laser driver 110, to the laser 112. In one embodiment, the modulator 310 performs fast modulation that is greater than 10 MHz. In one embodiment, the modulator 310 may change or modulate the current provided by the laser driver 110 by a few milliamps.

In one embodiment, the modulator 310 may need to be adjusted so that the modulator 310 is compatible with lasers with varying voltage requirements and with different gains. To provide flexibility, FIG. 3A illustrates external resistors 315 which can be selected by the user and used to modify the modulator 310 so it is compatible with different types of lasers. That is, depending on the selected laser 112, or the desired gain, the user can select values of the external resistors 315 to optimize the performance of the modulator 310. As shown, the package 300 and IC 305 have respective ports 380B and 380A which serve as connection interfaces so the user can electrically connect the resistors 315 to the modulator 310. Put differently, the resistors 315 are part of the modulator circuit even though they are external to the package 300.

FIG. 3B illustrates using a selectable bank of resistors 350 or 360 to optimize the modulator 310. Specifically, FIG. 3B illustrates two different scenarios. In the first scenario shown by the solid lines, the selectable bank of resistors 350 are disposed in the package 300 where the user can utilize a select signal 340 to control which resistance value or values are selected from the bank of resistors 350, thereby adjusting the modulator 310. Alternatively, the dashed lines illustrate that a selectable bank of resistors 360 (or a variable resistor) can instead be disposed in the IC 305. In either case, the user can optimize the performance of the modulator 310 to correspond to the particular type of laser 112 using the select signal 340.

As mentioned above in FIG. 1C, the sense resistor 115 can be implemented in the IC by a variable resistance, but that may be less desirable since resistors formed in ICs typically are of lower quality and introduce more noise than discrete resistors. However, the resistors for the modulator 310 do not need to be as low drift (and precise) as the sense resistor in order to provide an ultralow noise modulated current to the laser 112. Put differently, the resistors used by the modulator have less stringent stability requirements than the sense resistor used in the current source. Thus, placing a bank of resistors 360 in the IC 305 may be preferred since it may reduce cost and the overall size of the package 300 relative to putting the bank of resistors 350 in the package 300.

While FIGS. 3A and 3B illustrate VMOD being connected directly to the modulator 310, in other embodiment, $V_{MOD}$ may be supplied to the resistors instead—e.g., the resistors 315 in FIG. 3A or the resistors 350 or 360 in FIG. 3B.

Figure 4:
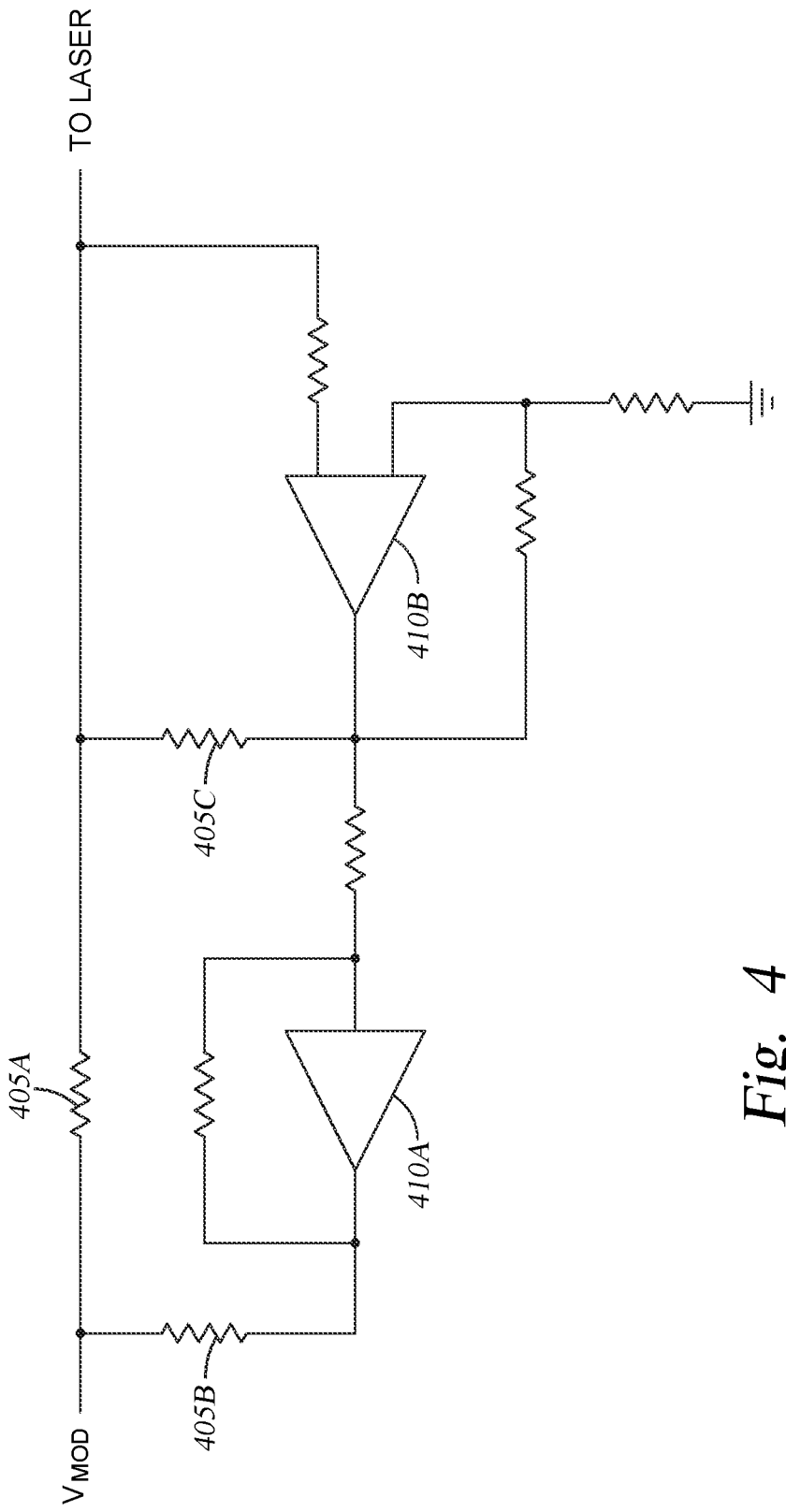
FIG. 4 is a circuit of a modulator, in one embodiment described herein.

FIG. 4 is a circuit of the modulator 310 in FIG. 3, in one embodiment described herein. As shown, the modulator 310 includes two stages formed by the op amps 410A and 410B. Generally, the function of the op amp 410A is to drive the input modulation voltage $V_{MOD}$ to zero. The op amp 410B, $V_{MOD}$, and the resistor 405A generate the modulated current for the laser and are referred to as a Howland modulator. The modulator 310 has high bandwidth which means it can quickly convert the input modulation signal at $V_{MOD}$ to a modulated current that is driven onto the laser. In one embodiment, the laser driver 110 and the modulator 310 are a Libbrecht-Hall current source design.

In one embodiment, the resistors 405A-C are adjustable using one of the techniques illustrated in FIGS. 3A and 3B. That is, in one embodiment, the resistors 405A-C may be disposed on a board external to the package and IC containing the modulator 310. In another example, the user may select the values of the resistors 405A-C using one or more banks of resistors in the package. In yet another example, the resistors 405A-C may be variable resistors in the IC containing the modulator 310.

Further, the circuit for the modulator 310 in FIG. 4 is just one example of a suitable modulator for a laser driver. For example, in another embodiment, the op amps 410 may be replaced by a transistor network. In general, the embodiments herein can be extended to any modulator design where flexibility is desired so the modulator can be optimized for different lasers. This flexibility can be obtained by including ports in the IC and the package so the user can connect their own circuit elements, or by providing selectable components in the IC or the package.

Figure 5A:
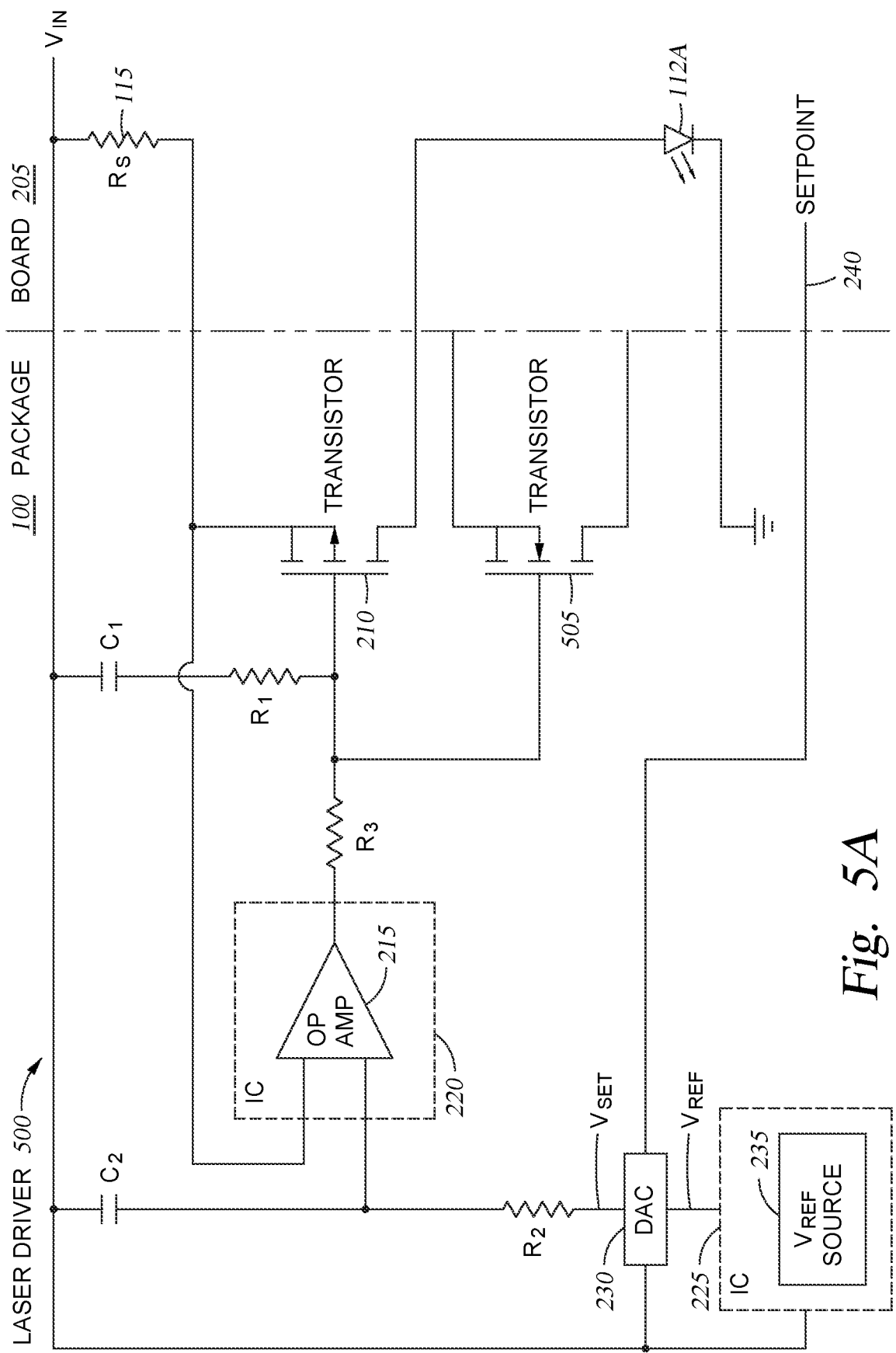
FIGS. 5A and 5B illustrates a laser driver for laser diodes with different polarities, in embodiments described herein.
Figure 5B:
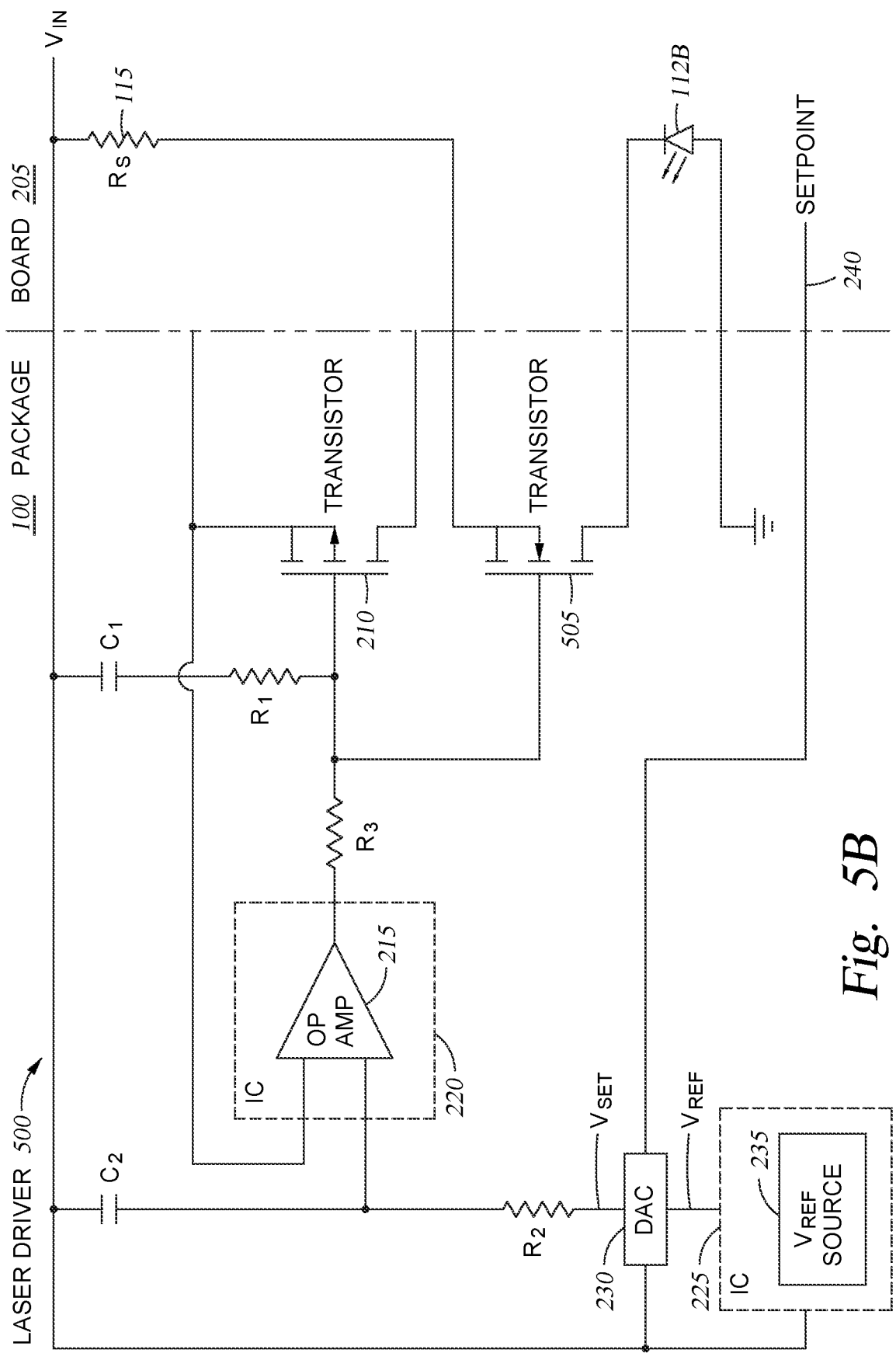

FIGS. 5A and 5B illustrates a laser driver 500 for laser diodes with different polarities, in embodiments described herein. As shown, the package 100 (or the IC) includes two different transistors—i.e., transistors 210 and 505—that can be selected depending on the polarity of the laser diode being used. The transistors 210 and 505 can be referred to as a first selectable transistor and a second selectable transistor, respectively.

FIG. 5A illustrates a first state of the laser driver 500 when a first polarity laser diode 112A is coupled to the package 100. In this state, the transistor 210 (e.g., a pMOS transistor) is coupled to the sense resistor 115 and the laser diode 112A. In contrast, the transistor 505 is unused.

FIG. 5B illustrates a second state of the laser driver 500 when a second polarity laser diode 112B is coupled to the package 100. In this state, the transistor 505 (e.g., an nMOS transistor) is coupled to the sense resistor 115 and the laser diode 112B, while the transistor 210 is unused. Thus, the package 100 (or the IC) can include two internal transistor 210 and 505 which can be added to the current source depending on the polarity of the laser diode 112 the user wishes to implement. As a result, the laser driver 500 provides greater flexibility to the user and enables the laser driver 500 to be used in many different applications that implement different polarity laser diodes.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. An integrated circuit comprising:
    a laser driver;
    a first connection interface configured to connect the laser driver to a first end of a sense resistor external to the integrated circuit;
    a second connection interface configured to connect an output of the laser driver to a laser external to the integrated circuit;
    a third connection interface configured to connect a second end of the sense resistor to the integrated circuit; and
    a fourth connection interface configured to connect the laser driver to an external transistor,
    wherein, when the sense resistor is connected to the first and third connection interfaces, the integrated circuit is configured to measure a voltage across the sense resistor using the first and third connection interfaces to affect the output of the laser driver,
    wherein, when the external transistor is connected to the fourth connection interface, the laser driver is configured to use the external transistor to drive a current to the laser via the second connection interface.

2. The integrated circuit of claim 1, wherein, when the external transistor is not connected to the fourth connection interface or is not enabled, the laser driver is configured to use an internal transistor to drive a current to the laser via the second connection interface,
    wherein, when the sense resistor is coupled to the first connection interface, the first end of the sense resistor is coupled to one of: a first end of the external transistor or a first end of the internal transistor.

3. The integrated circuit of claim 1, further comprising a modulator coupled to the second connection interface to drive a modulated current to the laser.

4. The integrated circuit of claim 3, further comprising:
    a fourth connection interface configured to couple the modulator to a second resistor external to the integrated circuit, wherein the second resistor, when connected to the fourth connection interface, alters the manner at which the modulator drives the modulated current to the laser.

5. The integrated circuit of claim 3, wherein the modulator comprises at least one of a variable resistor or a selectable bank of resistors, wherein the integrated circuit further comprises:
    a fourth connection interface configured to receive a select signal that sets a resistance value of the at least one variable resistor or selectable bank of resistors to alter the manner at which the modulator drives the modulated current to the laser.

6. The integrated circuit of claim 1, further comprising:
    a first selectable transistor in the laser driver, wherein the first selectable transistor is configured to be used when the laser has a diode of a first polarity; and
    a second selectable transistor in the laser driver, wherein the second selectable transistor is configured to be used when the laser has a diode of a second polarity different than the first polarity.

7. A package comprising:
    a first connection interface configured to connect to a first end of a sense resistor external to the package;
    a second connection interface configured to connect to a laser external to the package;
    a third connection interface configured to connect to a second end of the sense resistor; and
    an integrated circuit comprising:
        a laser driver,
        a fourth connection interface electrically coupling the first connection interface to the laser driver,
        a fifth connection interface electrically coupling the second connection interface to an output of the laser driver, and
        a sixth connection interface electrically coupling the third connection interface to the laser driver, and
    wherein, when the sense resistor is connected to the first and third connection interfaces, the integrated circuit is configured to measure a voltage across the sense resistor to affect the output of the laser driver.

8. The package of claim 7, further comprising:
    a seventh connection interface configured to connect the package to an external transistor,
    wherein the integrated circuit comprises a eighth connection interface electrically coupling the seventh connection interface to the laser driver, and
    wherein, when the external transistor is connected to the seventh connection interface, the laser driver is configured to use the external transistor to drive a current to the laser via the second and fifth connection interfaces.

9. The package of claim 8, wherein, when the external transistor is not connected to the seventh connection interface or is not enabled, the laser driver is configured to use an internal transistor to drive a current to the laser via the second and fifth connection interfaces.

10. The package of claim 9, wherein, when the sense resistor is coupled to the first connection interface, a first end of the sense resistor is coupled to one of: a first end of the external transistor or a first end of the internal transistor.

11. The package of claim 7, wherein the integrated circuit comprises a modulator coupled to the second connection interface to drive a modulated current to the laser.

12. The package of claim 11, further comprising:
    a seventh connection interface configured to couple the modulator to a second resistor external to the package, wherein the second resistor, when connected to the seventh connection interface, alters the manner at which the modulator drives the modulated current to the laser.

13. The package of claim 11, further comprising:
    a selectable bank of resistors coupled via a seventh connection interface in the integrated circuit to the modulator; and
    an eighth connection interface configured to receive a select signal that sets a resistance value of the selectable bank of resistors to alter the manner at which the modulator drives the modulated current to the laser.

14. The package of claim 11, wherein the modulator comprises at least one of a variable resistor or a selectable bank of resistors,
    a seventh connection interface configured to receive a select signal that sets a resistance value of the at least one variable resistor or selectable bank of resistors to alter the manner at which the modulator drives the modulated current to the laser.

15. The package of claim 7, further comprising:
a second integrated circuit comprising an operational amplifier, wherein the second integrated circuit is bonded to the integrated circuit such that the operational amplifier forms part of the laser driver, wherein the integrated circuit and the second integrated circuit are encased in a dielectric material.

16. The package of claim 15, comprising:
a third integrated circuit comprising a reference voltage source configured to provide a reference voltage to a digital to analog converter (DAC), wherein the DAC is located in one of the integrated circuit or the third integrated circuit, wherein the third integrated circuit is bonded to the integrated circuit such that the reference voltage source and the DAC forms part of the laser driver, wherein the integrated circuit, the second integrated circuit, and the third integrated circuit are encased in the dielectric material.

17. The package of claim 7, further comprising:
a first selectable transistor in the laser driver, wherein the first selectable transistor is configured to be used when the laser has a diode of a first polarity; and
a second selectable transistor in the laser driver, wherein the second selectable transistor is configured to be used when the laser has a diode of a second polarity different than the first polarity.

18. An integrated circuit comprising:
a laser driver;
a first connection interface configured to connect the laser driver to a first end of a sense resistor external to the integrated circuit;
a second connection interface configured to connect an output of the laser driver to a laser external to the integrated circuit;
a third connection interface configured to connect a second end of the sense resistor to the integrated circuit;
a modulator coupled to the second connection interface to drive a modulated current to the laser; and
a fourth connection interface configured to couple the modulator to a second resistor external to the integrated circuit, wherein the second resistor, when connected to the fourth connection interface, alters the manner at which the modulator drives the modulated current to the laser,
wherein, when the sense resistor is connected to the first and third connection interfaces, the integrated circuit is configured to measure a voltage across the sense resistor using the first and third connection interfaces to affect the output of the laser driver.

* * * * *